US008976322B2

(12) United States Patent
Kim et al.

(10) Patent No.: US 8,976,322 B2
(45) Date of Patent: Mar. 10, 2015

(54) ACTIVE MATRIX ORGANIC LIGHT-EMITTING DIODE DISPLAY AND METHOD OF CONTROLLING DISPLAY THEREOF

(75) Inventors: Jung Hyun Kim, Suwon-si (KR); Dong Sub Kim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 38 days.

(21) Appl. No.: 13/185,700

(22) Filed: Jul. 19, 2011

(65) Prior Publication Data

US 2012/0033144 A1 Feb. 9, 2012

(30) Foreign Application Priority Data

Aug. 6, 2010 (KR) .......................... 10-2010-0075774

(51) Int. Cl.
| | | |
|---|---|---|
| *G02F 1/1347* | (2006.01) | |
| *G02F 1/1335* | (2006.01) | |
| *G02F 1/13* | (2006.01) | |
| *H01J 1/62* | (2006.01) | |
| *G02F 1/137* | (2006.01) | |
| *G09G 3/20* | (2006.01) | |
| *H01L 27/32* | (2006.01) | |
| *G09G 3/36* | (2006.01) | |

(52) U.S. Cl.
CPC ........ *G02F 1/13718* (2013.01); *G02F 1/13473* (2013.01); *G09G 3/20* (2013.01); *H01L 27/3232* (2013.01); *G09G 3/3629* (2013.01); *H01L 27/3267* (2013.01); *G02F 2201/44* (2013.01); *G09G 2300/02* (2013.01); *G09G 2300/023* (2013.01); *G09G 2330/021* (2013.01)

USPC ................... 349/74; 349/80; 349/115; 349/1; 313/505

(58) Field of Classification Search
USPC ............. 349/1, 74, 80, 115; 345/88; 313/505, 313/506
See application file for complete search history.

(56) References Cited

U.S. PATENT DOCUMENTS

| 6,927,765 B1 * | 8/2005 | Masazumi et al. ............ 345/204 |
|---|---|---|
| 7,616,287 B2 * | 11/2009 | Nose et al. ..................... 349/175 |
| 2001/0040542 A1 * | 11/2001 | Harada et al. ................... 345/87 |
| 2004/0017523 A1 * | 1/2004 | Asada ............................. 349/86 |
| 2004/0090577 A1 * | 5/2004 | Hara .............................. 349/117 |
| 2004/0141120 A1 * | 7/2004 | Faris et al. ..................... 349/115 |

(Continued)

FOREIGN PATENT DOCUMENTS

| CN | 1851539 A | 10/2006 |
|---|---|---|
| CN | 1858840 A | 11/2006 |
| KR | 10-0826582 B1 | 4/2008 |

*Primary Examiner* — Michael Caley
*Assistant Examiner* — Jia Pan
(74) *Attorney, Agent, or Firm* — Jefferson IP Law, LLP (57) ABSTRACT

An Active Matrix Organic Light Emitting Diode (AMOLED) display and a method of controlling a display thereof are provided. The AMOLED display includes an input unit, a controller, a display unit for displaying a low power mode screen, by enabling the controller to turn off an AMOLED and to turn on a cholesteric Liquid Crystal Display (LCD) in a low power mode, and for displaying a high picture quality mode screen, by enabling the controller to turn on the AMOLED and to turn off the cholesteric LCD in a high picture quality mode. When used in an indoor environment, the AMOLED display can operate in the high picture quality mode, and when used in an outdoor environment or as an e-book reader, the AMOLED display can operate in the low power mode.

11 Claims, 6 Drawing Sheets

(56) References Cited

U.S. PATENT DOCUMENTS

| | | | |
|---|---|---|---|
| 2005/0206804 A1* | 9/2005 | Hara | 349/62 |
| 2006/0244702 A1 | 11/2006 | Yamazaki et al. | |
| 2007/0076135 A1* | 4/2007 | Gomyou et al. | 349/25 |
| 2008/0309598 A1* | 12/2008 | Doane et al. | 345/87 |
| 2009/0108757 A1* | 4/2009 | Lee et al. | 315/51 |
| 2009/0195568 A1 | 8/2009 | Sjodin | |
| 2010/0141689 A1* | 6/2010 | Johnson | 345/690 |
| 2010/0213443 A1* | 8/2010 | Sapochak et al. | 257/40 |
| 2010/0245221 A1* | 9/2010 | Khan | 345/87 |

* cited by examiner

ACTIVE MATRIX ORGANIC LIGHT-EMITTING DIODE DISPLAY AND METHOD OF CONTROLLING DISPLAY THEREOF

PRIORITY

This application claims the benefit under 35 U.S.C. §119(a) of a Korean patent application filed on Aug. 6, 2010 in the Korean Intellectual Property Office and assigned Serial No. 10-2010-0075774, the entire disclosure of which is hereby incorporated by reference.

BACKGROUND OF THE INVENTION

1. Field of the Invention

The present invention relates to an Active Matrix Organic Light Emitting Diode (AMOLED) display and a method of controlling a display thereof More particularly, the present invention relates to an AMOLED display and a method of controlling a display thereof that use a cholesteric Liquid Crystal Display (LCD) that can operate in a low power mode or a high picture quality mode.

2. Description of the Related Art

Nowadays, as a display used for a mobile terminal or an e-paper, an AMOLED display or a Liquid Crystal Display (LCD) are widely available. More particularly, an LCD is classified as a transmissive LCD, a reflective LCD, or a transflective LCD, according to a display method.

Because the transmissive LCD uses a backlight, a panel, and a line polarizing plate, the transmissive LCD has a low efficiency backlight, consumes a relatively large amount of current, and has low outdoor visibility. The AMOLED display that displays a screen without using external light has a high optical characteristic, but also consumes a relatively large amount of power.

The reflective LCD uses external light as a light source using a reflector, a panel, and a circular polarization plate, and has a reflexibility of less than 20%. Thus, the reflective LCD cannot display a screen at a location having a low indoor visibility and having no external light. The reflective LCD uses a cholesteric LCD, and a related art cholesteric LCD is described with reference to FIG. 1.

Figure 1:
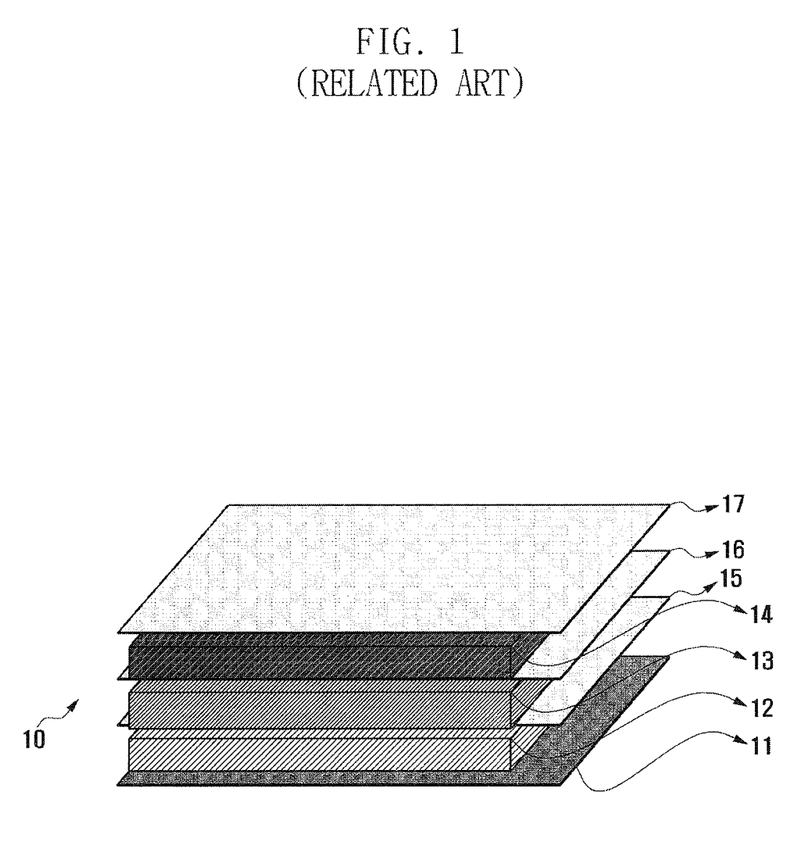
FIG. 1 is a perspective view illustrating a cholesteric Liquid Crystal Display (LCD) of the related art.

FIG. 1 is a perspective view illustrating a cholesteric LCD of the related art.

Referring to FIG. 1, a cholesteric LCD 10 includes an absorption layer 11, a first cholesteric liquid crystal color layer 12 in which a first transparent electrode film 15 is attached to an upper surface thereof, a second cholesteric liquid crystal color layer 13 in which a second transparent electrode film 16 is attached to an upper surface thereof, and a third cholesteric liquid crystal color layer 14 in which a third transparent electrode film 17 is attached to an upper surface thereof The absorption layer 11, the first cholesteric liquid crystal color layer 12, the second cholesteric liquid crystal color layer 13, and the third cholesteric liquid crystal color layer are sequentially stacked. In the cholesteric LCD 10, power is required only when a state of one or more of the cholesteric liquid crystal color layers 12, 13, and 14 changes, and thus the cholesteric LCD 10 has bistability, very low power consumption, a low optical characteristic, and a slow response speed.

The transflective LCD has a portion operating as a reflective LCD and other portions operating as a transmissive LCD by disposing a reflector at a part of a pixel, and has a structure entailing a little lower transmitting characteristic and higher outdoor visibility than that of the transmissive LCD. However, because of the reflector, the transflective LCD has a reduced aperture ratio, resulting in low luminance, and a reduced color reproduction ratio. Further, in order to obtain a desired color reproduction ratio, reflexibility is limited to about 2% to 5%, and therefore it is difficult to apply a high specification of display and to apply AMOLED technology. Further, due to the expansion of the e-book market, a further limitation has become increasingly important in reducing the required power consumption.

SUMMARY OF THE INVENTION

Aspects of the present invention are to address at least the above-mentioned problems and/or disadvantages and to provide at least the advantages described below. Accordingly, an aspect of the present invention is to provide an Active Matrix Organic Light Emitting Diode (AMOLED) display and a method of controlling a display thereof that can operate as an AMOLED of a high picture quality when used in an indoor environment or when viewing a motion picture, and that can operate as a cholesteric Liquid Crystal Display (LCD) of super low power consumption when used in an outdoor environment or when using as an e-book reader.

In accordance with an aspect of the present invention, an AMOLED display including an input unit and a controller is provided. The device includes a display unit for displaying a low power mode screen, by enabling the controller to turn off an AMOLED and to turn on a cholesteric LCD in a low power mode, and for displaying a high picture quality mode screen, by enabling the controller to turn on the AMOLED and to turn off the cholesteric LCD in a high picture quality mode.

Preferably, the display unit includes a cholesteric LCD including three cholesteric liquid crystal color layers of a first cholesteric liquid crystal color layer stacked at an upper surface of the AMOLED, a second cholesteric liquid crystal color layer stacked at an upper part of the first cholesteric liquid crystal color layer, and a third cholesteric liquid crystal color layer stacked at an upper part of the second cholesteric liquid crystal color layer.

In accordance with another aspect of the present invention, a method of controlling a display of an AMOLED display is provided. The method includes inputting, by an input unit, one of a low power mode and a high picture quality mode, determining, by a controller, which of the low power mode and the high picture quality mode is input, displaying, if the low power mode is input, a low power mode screen by turning off an AMOLED and turning on a cholesteric LCD by a display unit, and displaying, if the high picture quality mode is input, a high picture quality mode screen by turning on the AMOLED and turning off the cholesteric LCD by the display unit.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding, but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 2:
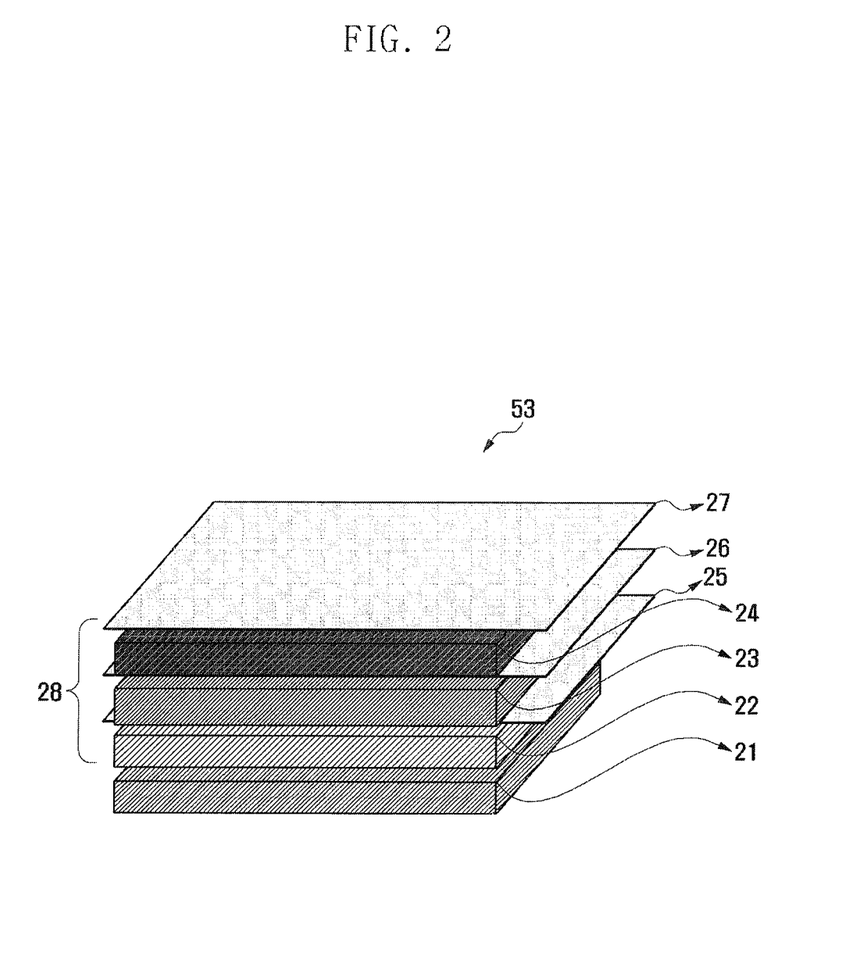
FIG. 2 is a perspective view illustrating a display unit of an Active Matrix Organic Light Emitting Diode (AMOLED) display according to an exemplary embodiment of the present invention.
Figure 3:
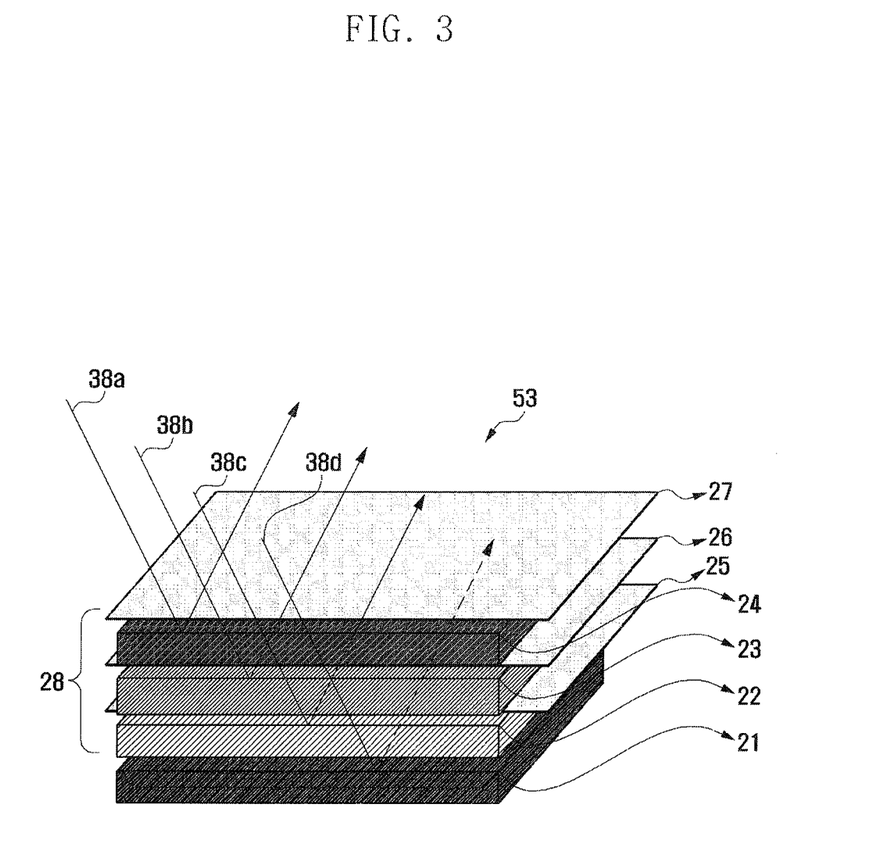
FIG. 3 is a diagram illustrating a low power mode operation of the display unit of FIG. 2 according to an exemplary embodiment of the present invention.
Figure 4:
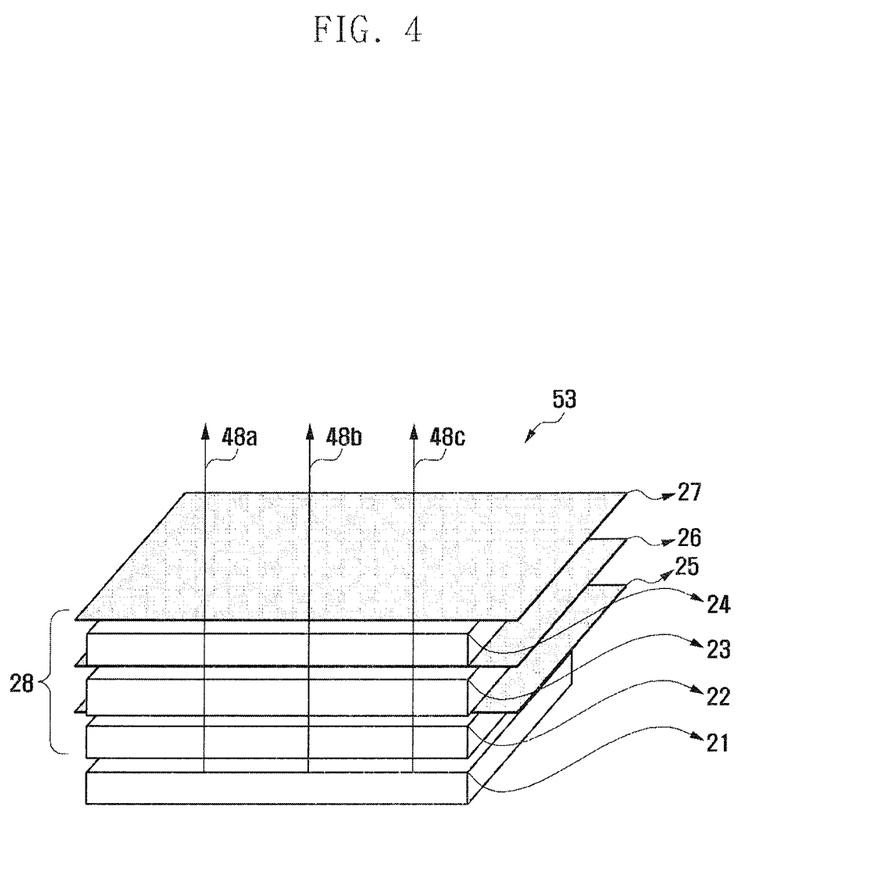
FIG. 4 is a diagram illustrating a high picture quality mode operation of the display unit of FIG. 2 according to an exemplary embodiment of the present invention.
Figure 5:
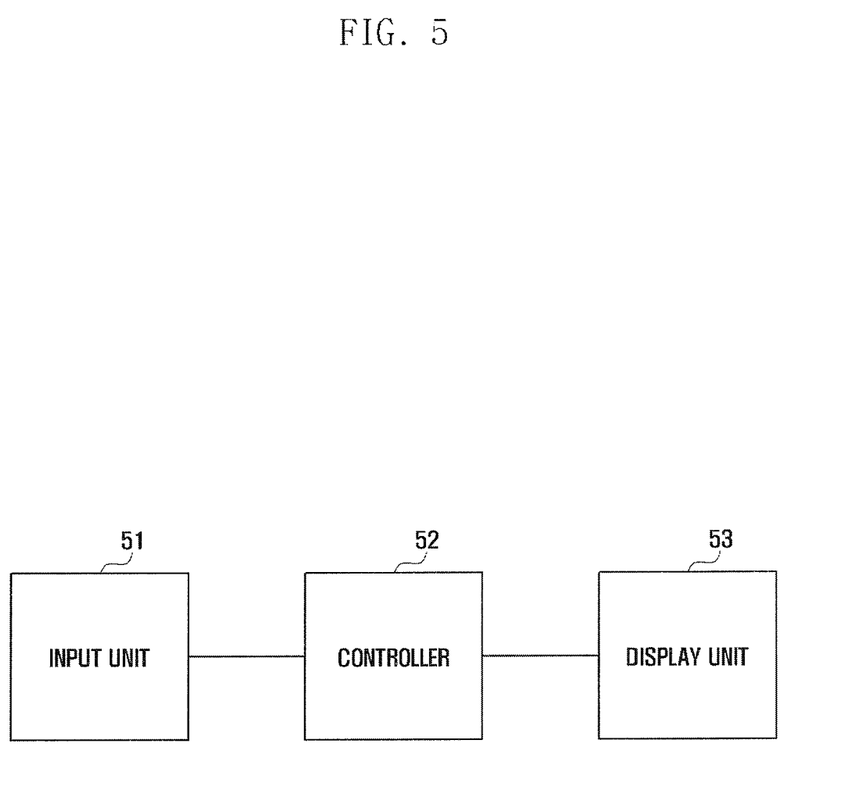
FIG. 5 is a block diagram illustrating a configuration of an AMOLED display according to an exemplary embodiment of the present invention.

FIG. 2 is a perspective view illustrating a display unit of an Active Matrix Organic Light Emitting Diode (AMOLED) display according to an exemplary embodiment of the present invention, FIG. 3 is a diagram illustrating a low power mode operation of the display unit of FIG. 2 according to an exemplary embodiment of the present invention, FIG. 4 is a diagram illustrating a high picture quality mode operation of the display unit of FIG. 2 according to an exemplary embodiment of the present invention, and FIG. 5 is a block diagram illustrating a configuration of an AMOLED display according to an exemplary embodiment of the present invention.

Referring to FIGS. 2 and 5, an AMOLED display according to an exemplary embodiment of the present invention is described.

The AMOLED display includes an input unit 51, a controller 52, and a display unit 53.

The input unit 51 inputs one of a low power mode and a high picture quality mode, and may be a touch pad or a keypad by which a user can select the mode, or a sensor that can automatically select the mode.

The controller 52 receives a low power mode input signal or a high picture quality mode input signal from the input unit 51, determines whether one of a low power mode and a high picture quality mode is input, outputs the low power mode control signal to the display unit 53 if the low power mode is input, and outputs a high picture quality mode control signal to the display unit 53 if the high picture quality mode is input. The controller of this exemplary embodiment may be formed as a microprocessor chip.

The display unit 53 displays a low power mode screen or a high picture quality mode screen and includes an AMOLED 21 and a cholesteric Liquid Crystal Display (LCD) 28.

The cholesteric LCD 28 includes a first cholesteric liquid crystal color layer 22 stacked at an upper surface of the AMOLED 21, a second cholesteric liquid crystal color layer 23 stacked at an upper part of the first cholesteric liquid crystal color layer 22, and a third cholesteric liquid crystal color layer 24 stacked at an upper part of the second cholesteric liquid crystal color layer 23.

Referring to FIG. 3, in the present exemplary embodiment, the first cholesteric liquid crystal color layer 22 selectively reflects or transmits blue color light 38c, the second cholesteric liquid crystal color layer 23 selectively reflects or transmits green color light 38b, and the third cholesteric liquid crystal color layer 24 selectively reflects or transmits red color light 38a. However, the present invention is not limited thereto, and one of the three cholesteric liquid crystal color layers 22, 23, and 24 can selectively reflect or transmit the red color light, another one can selectively reflect or transmit the green color light, and the remaining one can selectively reflect or transmit the blue color light.

A first transparent electrode film 25 is attached to an upper surface of the first cholesteric liquid crystal color layer 22, a second transparent electrode film 26 is attached to an upper surface of the second cholesteric liquid crystal color layer 23, and a third transparent electrode film 27 is attached to an upper surface of the third cholesteric liquid crystal color layer 24. The first transparent electrode film 25, the second transparent electrode film 26, and the third transparent electrode film 27 fix the first cholesteric liquid crystal color layer 22, the second cholesteric liquid crystal color layer 23, and the third cholesteric liquid crystal color layer 24, respectively, and perform a function of applying a voltage in order to reflect or transmit desired light. Further, in this exemplary embodiment the transparent electrode films 25, 26, and 27 are each made of Indium Tin Oxide (ITO), and a thickness thereof is preferably 0.05 μm to 0.12 μm.

In a low power mode, the AMOLED 21 is turned off and performs a same function as that of the absorption layer 11 of FIG. 1. That is, because a black color cannot be expressed with only the cholesteric liquid crystal color layers 22, 23, and 24, an absorption layer for expressing a black color should exist, and when power is not supplied, a light emitting body does not operate and thus the AMOLED 21 theoretically completely becomes a black color and performs a function of an absorption layer that absorbs light 38d. Further, as the cholesteric LCD 28 is turned on, the first cholesteric liquid crystal color layer 22, the second cholesteric liquid crystal color layer 23, and the third cholesteric liquid crystal color layer 24 selectively reflect or transmit blue color light 38c, green color light 38b, and red color light 38a, respectively. Accordingly, the AMOLED display can operate as a low power cholesteric LCD.

Referring to FIG. 4, a high picture quality mode operation of the display unit 53 of FIG. 2 is described. In a high picture quality mode, as the cholesteric LCD 28 is turned off, the first cholesteric liquid crystal color layer 22, the second cholesteric liquid crystal color layer 23, and the third cholesteric liquid crystal color layer 24 continue to transmit unfiltered all color light, i.e., all red color light 48a, green color light 48b, and blue color light 48c. Further, as the AMOLED 21 is turned on, power is supplied and thus the AMOLED 21 is driven. Because the AMOLED 21 is formed by coating a kind of film (not shown) on a light emitting body, when external light is strong such a film can function as a reflector. Therefore, in order to prevent strong external light from being reflected, it is necessary to attach a circular polarization plate to an upper part thereof. In the AMOLED display according to the present exemplary embodiment, the cholesteric liquid crystal color layers 22, 23, and 24 can perform a function of a circular polarization plate. More particularly, when a cholesteric liquid crystal cell has a thickness of 14 μm or more, right circular polarized light can be totally reflected and thus it is preferable that at least one of three cholesteric liquid crystal color layers 22, 23, and 24 has each a thickness of 14 μm or more.

According to the present exemplary embodiment, by stacking three cholesteric liquid crystal color layers 22, 23, and 24 at an upper part of the AMOLED 21, when used in an indoor environment or when viewing a motion picture, the AMOLED 21 can operate as a high picture quality AMOLED, and when used in an outdoor environment or as an e-book reader, the AMOLED 21 can operate as a cholesteric LCD of super low power. Further, because the AMOLED 21 of the present exemplary embodiment has a structure in which a circular polarization plate of an AMOLED display of the related art is replaced with a cholesteric LCD in which an absorption layer is removed instead of a simple combination of an AMOLED display of the related art and a conventional cholesteric LCD of the related art, a thickness and cost of the AMOLED 21 can be reduced further than those of a simple combination of a AMOLED of the related art display and a cholesteric LCD of the related art.

Figure 6:
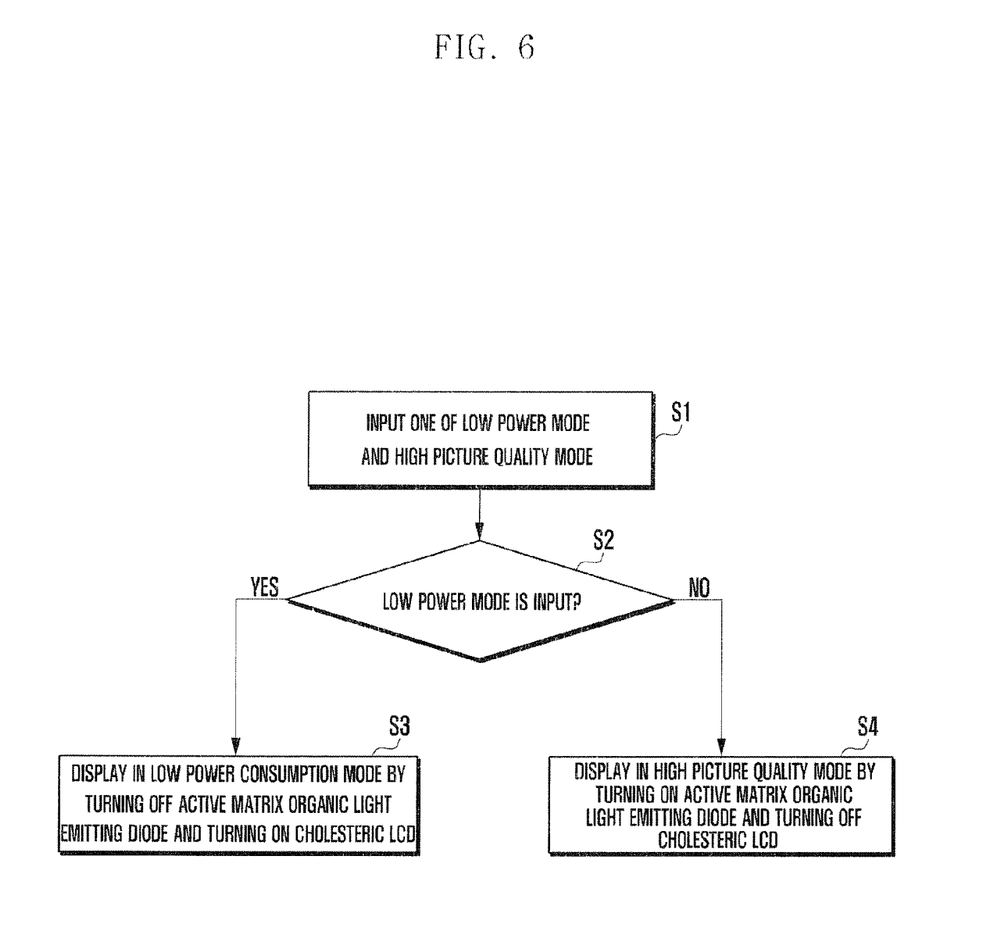
FIG. 6 is a flowchart illustrating a method of controlling a display of the AMOLED display of FIG. 5 according to an exemplary embodiment of the present invention.

FIG. 6 is a flowchart illustrating a method of controlling a display of the AMOLED display of FIG. 5 according to an exemplary embodiment of the present invention.

Referring to FIGS. 2 to 6, a method of displaying an AMOLED display according to an exemplary embodiment of the present invention is described.

First, one of a low power mode and a high picture quality mode is input by the input unit 51 at step S1.

The controller 52 determines whether a low power mode is input at step S2.

If it is determined that the low power mode is input, the controller 52 controls the display unit 53 to display in the low power mode by turning off the AMOLED 21 and turning on the cholesteric LCD 28 at step S3.

If it is determined that the low power mode is not input, i.e., if it is determined that the high picture quality mode is input at step S2, the controller 52 controls the display unit 53 to display in the high picture quality mode by turning on the AMOLED 21 and turning off the cholesteric LCD 28 at step S4.

In this way, in a method of controlling a display of an AMOLED display according to the present exemplary embodiment, because a low power mode screen or a high picture quality mode screen can be displayed according to an input, an appropriate mode screen can be displayed according to a user environment or a user viewing image.

As described above, according to an exemplary embodiment of the present invention, when used in an indoor environment or when viewing a motion picture, an AMOLED display may operate as an AMOLED of a high picture quality, and when used in outdoor environment or as an e-book reader, the AMOLED display can operate as a cholesteric LCD of super low power.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An Active Matrix Organic Light Emitting Diode (AMOLED) display comprising an input unit and a controller, the display comprising:
    a display unit that displays a low power mode screen, by enabling the controller to turn off an AMOLED and to turn on a cholesteric Liquid Crystal Display (LCD) in a low power mode, and that displays a high picture quality mode screen, by enabling the controller to turn on the AMOLED and to turn off the cholesteric LCD in a high picture quality mode,
    wherein the cholesteric LCD is integrally manufactured at an upper surface of the AMOLED, the cholesteric LCD and the AMOLED are integrally manufactured in a stacked configuration, and the integrally manufactured stacked configuration is devoid of a polarization plate,
    wherein light emitted from the AMOLED is visibly transmitted through the cholesteric LCD in the high picture quality mode,
    wherein the cholesteric LCD comprises three cholesteric liquid crystal color layers, and at least one of the three cholesteric liquid crystal color layers performs a function of a circular polarization plate in the high picture quality mode, and
    wherein the controller determines information of a content to be displayed and of an environment of the display, and if the controller determines that at least one of the content to be displayed and the environment of the display requires the high picture quality mode, controls to display the content in the high picture quality mode screen.

2. The display of claim 1, wherein the three cholesteric liquid crystal color layers comprise a first cholesteric liquid crystal color layer stacked at the upper surface of the AMOLED, a second cholesteric liquid crystal color layer stacked at an upper part of the first cholesteric liquid crystal color layer, and a third cholesteric liquid crystal color layer stacked at an upper part of the second cholesteric liquid crystal color layer.

3. The display of claim 2, wherein a first transparent electrode film for fixing the first cholesteric liquid crystal color layer and for applying a voltage is attached to an upper surface of the first cholesteric liquid crystal color layer,
    wherein a second transparent electrode film for fixing the second cholesteric liquid crystal color layer and for applying a voltage is attached to an upper surface of the second cholesteric liquid crystal color layer, and
    wherein a third transparent electrode film for fixing the third cholesteric liquid crystal color layer and for applying a voltage is attached to an upper surface of the third cholesteric liquid crystal color layer.

4. The display of claim 2, wherein one of the three cholesteric liquid crystal color layers selectively reflects or transmits red color light, another one selectively reflects or transmits green color light, and the remaining one selectively reflects or transmits blue color light.

5. The display of claim 2, wherein the at least one of the three cholesteric liquid crystal color layers comprises a thickness of 14 μm or more.

6. The display of claim 5, wherein the at least one of the three cholesteric liquid crystal color layers performing the function of the circular polarization plate totally reflects right circular polarized light.

7. The display of claim 1, wherein the controller determines one of the low power mode and the high picture quality mode in accordance with a user selection input by the input unit.

8. The display of claim 1, wherein the controller determines one of the low power mode and the high picture quality mode in accordance with a content to be displayed on the display.

9. The display of claim 1, wherein the controller determines one of the low power mode and the high picture quality mode in accordance with an environment in which the display is used.

10. The display of claim 1, wherein the cholesteric LCD is devoid of an absorption layer.

11. The display of claim 1, wherein the AMOLED performs a function of an absorption layer that absorbs light for expressing a black color when in the low power mode.

* * * * *